US010154593B2

(12) United States Patent
Gottwald et al.

(10) Patent No.: US 10,154,593 B2
(45) Date of Patent: Dec. 11, 2018

(54) ELECTRONIC ASSEMBLY GROUP AND METHOD FOR PRODUCING THE SAME

(71) Applicant: Schweizer Electronic AG, Schramberg (DE)

(72) Inventors: Thomas Gottwald, Dunningen-Seedorf (DE); Christian Rössle, St. Georgen (DE)

(73) Assignee: SCHWEIZER ELECTRONIC AG, Schramburg (DE)

( * ) Notice: Subject to any disclaimer, the term of this patent is extended or adjusted under 35 U.S.C. 154(b) by 0 days.

(21) Appl. No.: 15/375,578

(22) Filed: Dec. 12, 2016

(65) Prior Publication Data

US 2017/0127524 A1 May 4, 2017

Related U.S. Application Data

(63) Continuation of application No. 14/171,379, filed on Feb. 3, 2014, which is a continuation of application No. PCT/EP2012/002622, filed on Jun. 21, 2012.

(51) Int. Cl.
*H05K 1/00* (2006.01)
*H05K 1/18* (2006.01)
(Continued)

(52) U.S. Cl.
CPC ........... *H05K 1/185* (2013.01); *H01L 23/645* (2013.01); *H01L 24/19* (2013.01); *H01L 24/20* (2013.01);
(Continued)

(58) Field of Classification Search
CPC ........ H01G 4/232; H01G 4/228; H01G 4/236; H01G 4/248; H01G 4/252; H01G 4/06; H01G 4/08; H01G 4/12; H01G 4/1209; H01G 4/1218; H01G 4/1227; H01G 4/1236; H01G 4/1245; H01G 4/1254; H01G 4/1263; H01G 4/1272; H01G 4/1281; H01G 4/129; H01G 4/28; H05K 2201/09754; H05K 2201/0999; H05K 5/006; H05K 7/142; H05K 2201/09036; H05K 5/0286; H05K 7/1418; H05K 7/1489; H05K 7/183;
(Continued)

(56) References Cited

U.S. PATENT DOCUMENTS 3,978,375 A 8/1976 Fukui et al.
4,037,270 A * 7/1977 Ahmann ............ H01L 23/4093 174/541

(Continued)

FOREIGN PATENT DOCUMENTS

| | | |
|---|---|---|
| DE | 197 17 550 | 10/1998 |
| EP | 1 788 596 | 5/2007 |
| JP | 11 089247 | 3/1999 |

*Primary Examiner* — Pete Lee
(74) *Attorney, Agent, or Firm* — Shlesinger, Arkwright & Garvey LLP

(57) ABSTRACT

An electronic assembly group comprising a printed circuit board structure in a multilayer configuration that has at least two electrically conductive layers. The electronic assembly group also comprises an additional passive component that is connected to the two electrically conductive layers, each of which has at least one segment that extends beyond the multilayer structure to form connection regions, the passive component making contact directly at the connection regions.

15 Claims, 13 Drawing Sheets

50
40
C
12.2
14.1
40
70
70
L
L
60
14
12
18
16
22
20

(51) Int. Cl.

| | |
|---|---|
| ***H01L 23/64*** | (2006.01) |
| ***H02K 9/22*** | (2006.01) |
| ***H05K 3/46*** | (2006.01) |
| ***H02K 11/30*** | (2016.01) |
| ***H02K 11/33*** | (2016.01) |
| ***H05K 1/02*** | (2006.01) |
| ***H05K 3/30*** | (2006.01) |
| *H01G 2/06* | (2006.01) |
| *H05K 3/00* | (2006.01) |
| *H05K 3/34* | (2006.01) |
| *H05K 3/40* | (2006.01) |
| *H01L 23/00* | (2006.01) |

(52) U.S. Cl.

CPC ............... *H02K 9/22* (2013.01); *H02K 11/30* (2016.01); *H02K 11/33* (2016.01); *H05K 1/0204* (2013.01); *H05K 1/0271* (2013.01); *H05K 1/18* (2013.01); *H05K 1/184* (2013.01); *H05K 3/0044* (2013.01); *H05K 3/30* (2013.01); *H05K 3/40* (2013.01); *H05K 3/4038* (2013.01); *H05K 3/4602* (2013.01); *H01G 2/065* (2013.01); *H01L 24/16* (2013.01); *H01L 24/32* (2013.01); *H01L 2224/16225* (2013.01); *H01L 2224/211* (2013.01); *H01L 2224/2105* (2013.01); *H01L 2224/32237* (2013.01); *H01L 2224/73267* (2013.01); *H01L 2924/1431* (2013.01); *H01L 2924/15787* (2013.01); *H01L 2924/19041* (2013.01); *H01L 2924/19042* (2013.01); *H01L 2924/19106* (2013.01); *H05K 3/0061* (2013.01); *H05K 3/3442* (2013.01); *H05K 3/4092* (2013.01); *H05K 2201/0397* (2013.01); *H05K 2201/1003* (2013.01); *H05K 2201/10015* (2013.01); *H05K 2201/10022* (2013.01); *H05K 2203/0228* (2013.01)

(58) Field of Classification Search

CPC ...... H05K 1/03; H05K 1/0306; H05K 1/0313; H05K 1/0393; H05K 3/4605; H05K 9/0075; H05K 5/0021; H05K 7/1401; H05K 7/1409; H05K 7/1417

See application file for complete search history.

(56) References Cited

U.S. PATENT DOCUMENTS

| | | | | | |
|---|---|---|---|---|---|
| 4,158,218 | A * | 6/1979 | McLaurin | H01G 2/065 | 361/306.1 |
| 4,258,411 | A * | 3/1981 | Sherman | H05K 1/0231 | 174/521 |
| 4,295,184 | A | 10/1981 | Fukui et al. | | |
| 5,290,971 | A | 3/1994 | Hamaguchi | | |
| 5,672,414 | A | 9/1997 | Okamoto | | |
| 6,305,972 | B1 | 10/2001 | Isbell et al. | | |
| 6,400,551 | B1 | 6/2002 | Lin | | |
| 2008/0264687 | A1 | 10/2008 | Park | | |
| 2010/0133670 | A1* | 6/2010 | Liu | H01L 23/49524 | 257/675 |
| 2011/0228507 | A1* | 9/2011 | Yin | H01L 23/49531 | 361/811 |
| 2011/0290546 | A1* | 12/2011 | Lee | H01L 21/568 | 174/260 |

* cited by examiner

ELECTRONIC ASSEMBLY GROUP AND METHOD FOR PRODUCING THE SAME

RELATED APPLICATIONS

This is a continuation of application Ser. No. 14/171,379, filed Feb. 3, 2014, which is a continuation of International PCT Application No. PCT/EP2012/002622, filed on Jun. 21, 2012, which claims priority from German application No. 10 2011 105 346.1, filed on Jun. 21, 2011, and all of the aforementioned applications are hereby incorporated by reference.

FIELD OF THE INVENTION

The present invention relates to an electronic assembly group and a method for its production, as well as an electric motor, for example for use in a motor vehicle.

BACKGROUND OF THE INVENTION

Electronic components, or electronic units or assemblies for power electronics, are known, for example, in the form of DCB (Direct Copper Bonding) modules. This usually means ceramic substrate with soldered power semiconductors, onto which further necessary (passive) component parts are connected. In the case of inverters/rectifiers these component parts can be capacitors, particularly film capacitors and inductors.

Based on the above, an electronic assembly group and a method for producing the same, as well as an arrangement of a multilayer printed circuit board structure with an integrated power semiconductor and an additional passive component part and an electric motor are proposed according to the invention.

SUMMARY OF THE INVENTION

The electronic assembly group according to the invention comprises a printed circuit board structure with a multilayer structure or multilayer configuration. The multilayer structure contains, in a conventional manner, at least two electrically conductive layers. The invention proposes to lengthen each of these two layers in such a way that they exhibit a section projecting beyond the multilayer structure, said section defining a connection region for direct contact formed by an additional passive component part. These connection regions can be designed, for example, in a lattice-like or striped form.

This allows a significant reduction of the strongly present parasitic inductions in the known DCB modules with their long lines and connections. Additionally, a short and low-inductive connection of power semiconductors in the multilayer structure and a compact design is made possible. The number of connection points between the active and the passive component parts, particularly by bonding, is reduced, since only the connection region projecting from the printed circuit board core remains to be connected with the passive component part. The additional passive component part, for example, can be a capacitor and/or an inductor and/or a resistor.

For the production of an electronic assembly group according to the invention, a multilayer structure with an electrically conductive carrier layer and at least one further electrically conductive layer are provided. The carrier layer and the further electrically conductive layer have layer sections projecting beyond the core region of the multilayer structures. Any layer sections not needed as connection regions are at least partially removed, and also the prepreg layer sections projecting beyond the core region are at least partially removed. If necessary, remaining layer sections that project beyond the core region are bent to create connection regions for a passive component part. This provides a particularly simple production of a compact assembly with integrated connection regions that project beyond the actual layer structure for a direct low-inductive connection of a passive component part without additional intermediary.

According to one variant, before the steps of the partial removal, at least one through-connection between a projecting layer section of the further electrically conductive layer and a projecting layer section of the carrier layer is established, and the projecting layer section of the further electrically conductive layer is separated from the further electrically conductive layer. This achieves the result that both connection regions projecting beyond the multilayer structure lie on the same plane and have the same thickness.

By combining the connection regions projecting beyond the multilayer structure with inductive component parts, such as, for example, ferrite cores, targeted inductors with specific values can additionally be created. These inductive component parts can be used alone or also in combination with other passive component parts such as a capacitor.

The connection regions can exhibit at least one recess, with a contact pad contained within it, for contact with a passive component part. This simplifies the direct connection with the passive component part. The contact pad, for example, can be electrically connected to the connection region via at least one holding web or holding bar. Due to this, during soldering/welding lower heat dissipation occurs because of the reduced cross-section of the holding web. The contact pads can thus, for example, be soldered directly to the Schoop layer of a film capacitor. Different geometries are possible for the arrangement of the contact pads and also the holding webs. The holding webs can be arranged in such a way that they take on different expansion coefficients or the related mechanical tensions during use. The holding webs can, for example, be arranged in a meandering or zig-zag way, or can allow deformation or twisting due to their mounting geometries.

Further advantages and embodiments of the invention are apparent from the description and the attached drawing.

It is obvious that the aforementioned features, and those which are still to be mentioned below, may be used not only in the respectively stated combination, but also in other combinations or also by themselves, without exceeding the scope of the present invention.

The invention is represented for illustrative purposes by means of exemplary embodiments depicted via schematic drawings (not to scale), and is described in detail in the following, with references to the illustration in question.

DETAILED DESCRIPTION OF THE INVENTION

Figure 1:
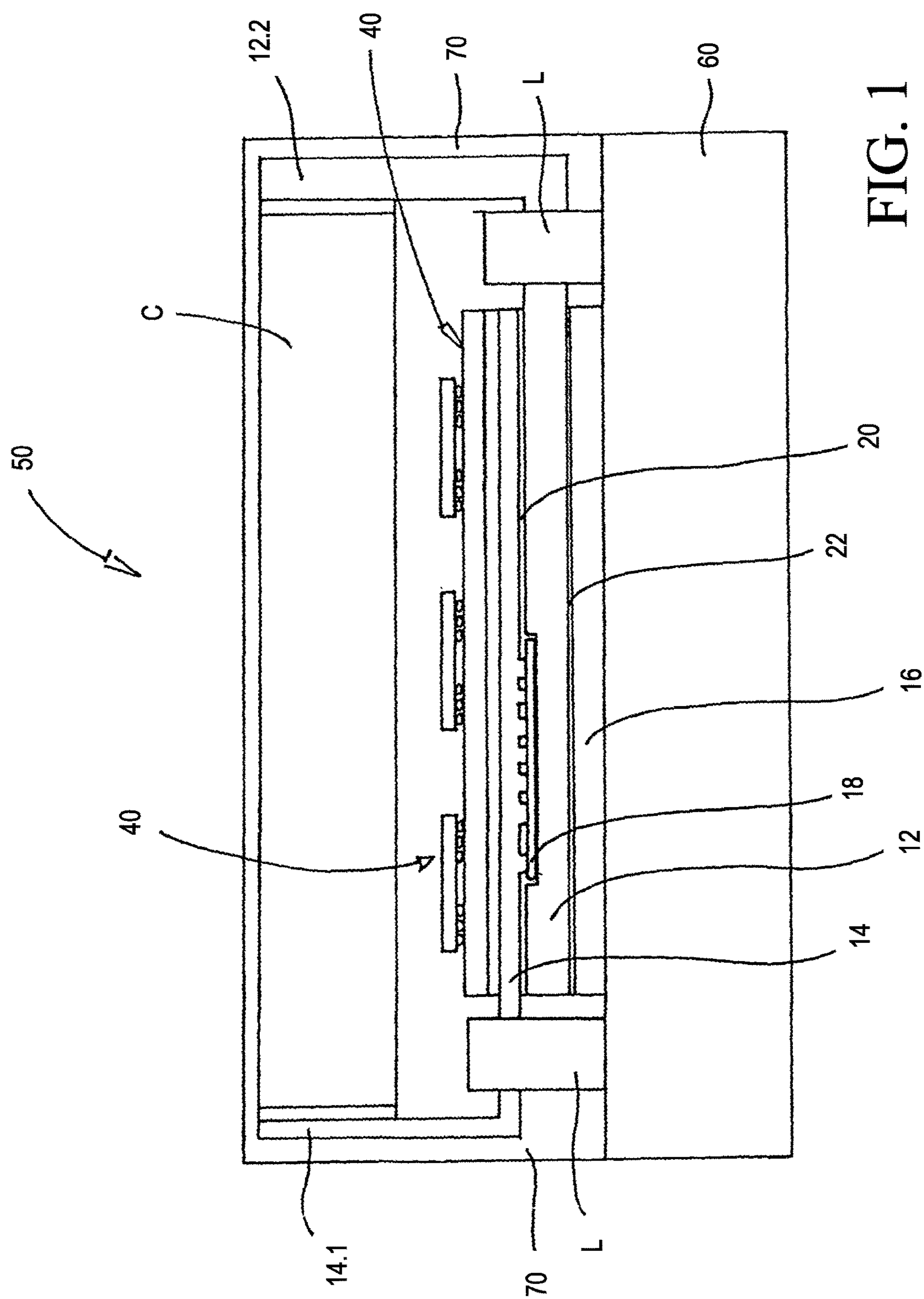
FIG. 1 shows a side view cutaway diagram through a first exemplary embodiment of an electronic assembly group of the invention.

FIG. 1 shows an electronic assembly group 50 according to the invention in a side view cutaway diagram.

Assembly 50 contains a multilayer printed circuit board structure that has a carrier layer 12 which carries an (embedded) semiconductor component part 18. Extending above the carrier layer 12 and the semiconductor component part 18 is a prepreg layer or one resin layer 20 from an earlier prepreg layer above which lies a further electrically conductive layer 14. It has a through-connection to the semiconductor component part 18. On the top layer 14 a logic circuit 40 can be attached as shown, for example by lamination. According to the exemplary embodiment shown, an electronic assembly group is a rectifier/inverter system in bridge arrangement, and the appropriate logic control. However, the logic circuit pictured can also be a separate circuit, and be coupled with conventional connection technology to the power electronic part.

Beneath the carrier layer a second further electrically conductive layer 16 is provided—separated by a second prepreg layer 22. It is arranged such as to be electrically insulated from layer 12, but its material thickness and its material properties are selected in such a way that good thermal conductivity and simultaneously high dielectric strength is achieved. The arrangement is positioned with the second further layer 16 at a heat sink 60.

The connection with the heat sink 60 can be made directly in the factory, so that the assembly according to the invention is delivered already complete with a cooling element. This would be an option, for example, in the compact design shown in FIG. 2 with a ring capacitor surrounding the multilayer structure including the heat sink. On the other hand, the assembly can also be connected only at the destination with the element serving as a heat sink possibly already present there. The underside or bottom side of the assembly (i.e., the underside of the second conductive layer 16) can have an adhesive paste layer or similar (not shown), with sufficient thermal conductivity (cf. the example of a motor vehicle electric motor in Paragraph [0031] described below).

The carrier layer 12 is extended beyond the original multilayer structure—to the right in the depiction of FIG. 1—and forms a connection region 12.2. In an analogous manner the further conductive layer 14 is extended in the opposite direction beyond the “core region” or “functional region” of the multilayer structure, to form a connection region 14.1. In the illustrated exemplary embodiment, the connection regions 12.2 and 14.1 are connections for a capacitor C, which are thus directly connected to the drain and source connections of the power semiconductor.

In this manner according to the invention, connection regions 12.2, 14.1 are directly led out of the multilayer printed circuit board structure and are directly connected with a passive component part, i.e. in the present example a capacitor. Thereby a short connection from the passive component part to the semiconductor component part 18 is achieved. The electronic assembly group according to the invention is of simple construction and has a significantly raised assembly density/integration as well as reduced parasitic inductions.

In addition, the connection regions 14.1 and 12.2 are executed as a load inductor L. The load inductor L can be formed, for example, by one or more ferrite cores.

The design according to the invention additionally permits direct contact of at least one of the load inductor-forming ferrite cores with the heat sink 60.

Figure 2:
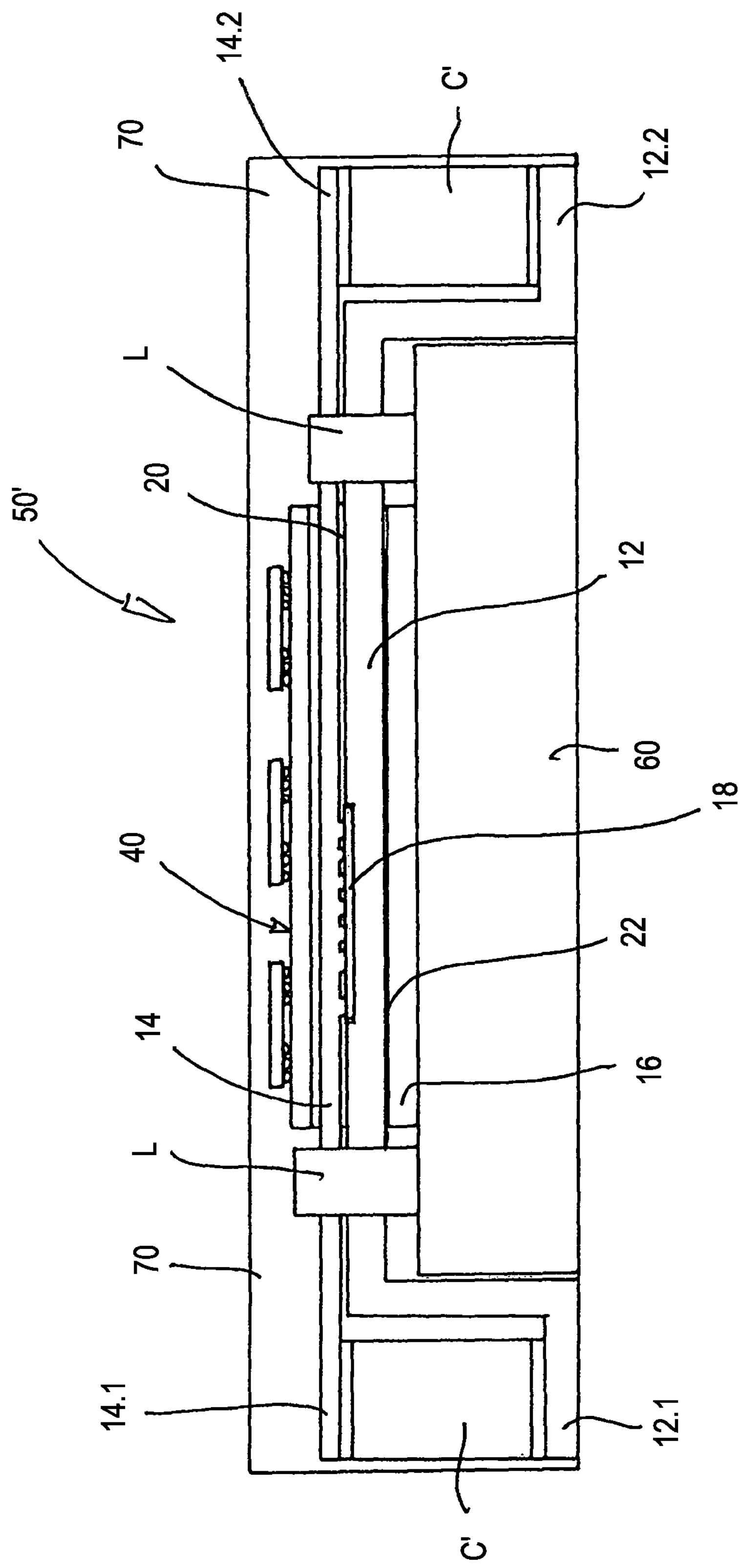
FIG. 2 shows a side view cutaway diagram through a second exemplary embodiment of an electronic assembly group of the invention.

FIG. 2 shows an alternative design of the electronic assembly group 50 of the invention, having a ring-shaped capacitor C that is arranged surrounding the printed circuit board structure. The drain/source connection regions 12.1, 14.1, 12.2, 14.2 in this case emerge on both sides of the structure from the carrier layer 12 and the further electrically conductive layer 14 so that altogether four connection regions 12.1, 14.1, 12.2, 14.2 are present. Basically, the ring capacitor can be connected with only two connections (as in the exemplary embodiment in FIG. 1); with four connections, however, the parasitic inductions that occur in the Schoop layer of the ring capacitor would be reduced by half.

As is evident from the illustration of FIG. 2, by using a ring capacitor the invention allows an especially compact and flat design, since the entire internal structure including the heat sink 60 is surrounded by the capacitor. In an arrangement of this sort, the connection regions according to the invention can be relatively short. The ring capacitor receives within its inside (i.e. the opening of the ring) the multilayer printed circuit board structure from which the connection regions extend. The connection regions are directly connected to the connections of the ring capacitor. In the illustrated exemplary embodiment the heat sink 60 is also arranged inside the ring capacitor, in order to achieve the most compact design.

Of course, this can also be achieved with a rectangular capacitor. Alternatively, two separated capacitor packs can be placed left and right on the connection pairs 12.1, 14.1 and 12.2, 14.2.

In a specific application, the electronic assembly group can be a rectifier/converter in an electric motor for an automobile. In this case, the assembly group can be placed in a particularly space-saving manner directly (with a suitable thermally conductive connective layer (e.g. adhesive pastes, sinter pastes, soldering pastes, etc.) in-between to prevent air gaps) on a cooling section (already present) of the electric motor, such that this forms the heat sink 60, and no separate heat sink is necessary.

Figure 3:
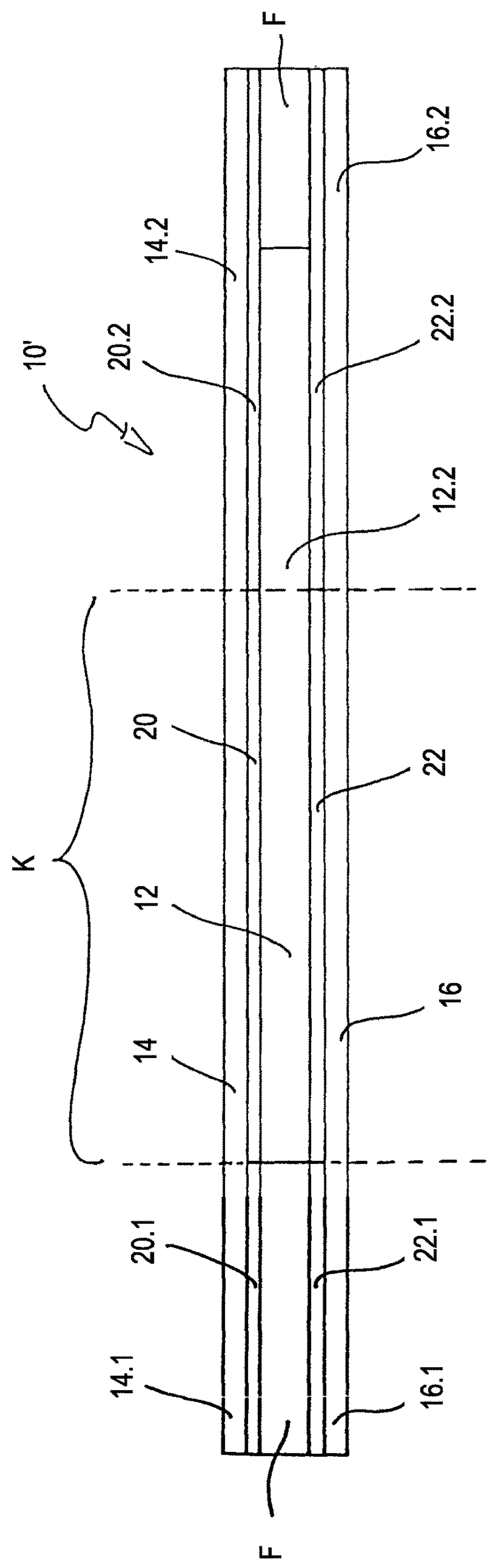
FIGS. 3 through 6 illustrate the production of the connection regions according to the invention.

In order to produce an electronic assembly group according to the invention, a standard multilayer structure 10' is provided (cf. FIG. 3). This multilayer structure may be, e.g., a structure such as that known from the parallel German patent application 10 2010 060 855.6 of the same applicant.

The multilayer structure 10' provided comprises a first conductive layer 12, representing a carrier layer for a semiconductor component 18 (not depicted). The multilayer structure 10' also comprises a further electrically conductive layer 14 which is located above the first conductive layer 12 in the depiction of FIG. 3. A prepreg layer 20 which may consist of thermally conductive material is provided between the two layers 12, 14.

The multilayer structure 10' further comprises a second electrically conductive layer 16 which is located underneath the first conductive layer 12 in the depiction of FIG. 3 and separated from it by a second prepreg layer 22. This prepreg layer 22 may also consist of thermally conductive material.

The further electrically conductive layers 14, 16 may be copper foils, which can additionally be plated.

The multilayer printed circuit board structure of the invention may have a symmetrical structure around the carrier layer 12, i.e. the prepreg layers 20, 22 have the same thickness, just as the further conductive layers 14, 16 are each of the same thickness. The symmetry of the structure results in a high level of reliability of the assembly. While asymmetrical structures such as DCB substrates tend to bend when subjected to the strain of temperature changes, this behavior is inhibited with the symmetrical structure described here.

The actual size/width of the electronic assembly group to be produced is indicated in FIG. 3 by the two dashed vertical lines, and is hereinafter termed the "core region" or functional region K. In order to produce the layer sections extending beyond the multilayer structure according to the invention, the layers of the multilayer structure 10' extend in this process stage as far beyond the dashed lines on both sides as corresponds to the desired length of the eventual/future connection regions. These sections of the layers are designated by the addition of "0.1" or "0.2" to the reference signs. To the left and right (in the representation of the figures) of the carrier layer 12 or 12.2, respectively, are internal layers F which have been exposed by milling.

In the regions to the left and right of the dashed lines, the prepreg layers 20.1, 20.2, 22.1, and 22.2 may consist of the same (thermally conducting) material as in the "core region" K between the dashed lines, or if indicated by cost considerations—of a cheaper standard material. That section of the multilayer printed circuit board structure containing the power electronic and, if applicable, control function is designated as core region K or functional region. The sections projecting beyond this core region serve to realize the idea or gist of the invention, namely to create the possibility of a direct connection for passive components.

Figure 4:
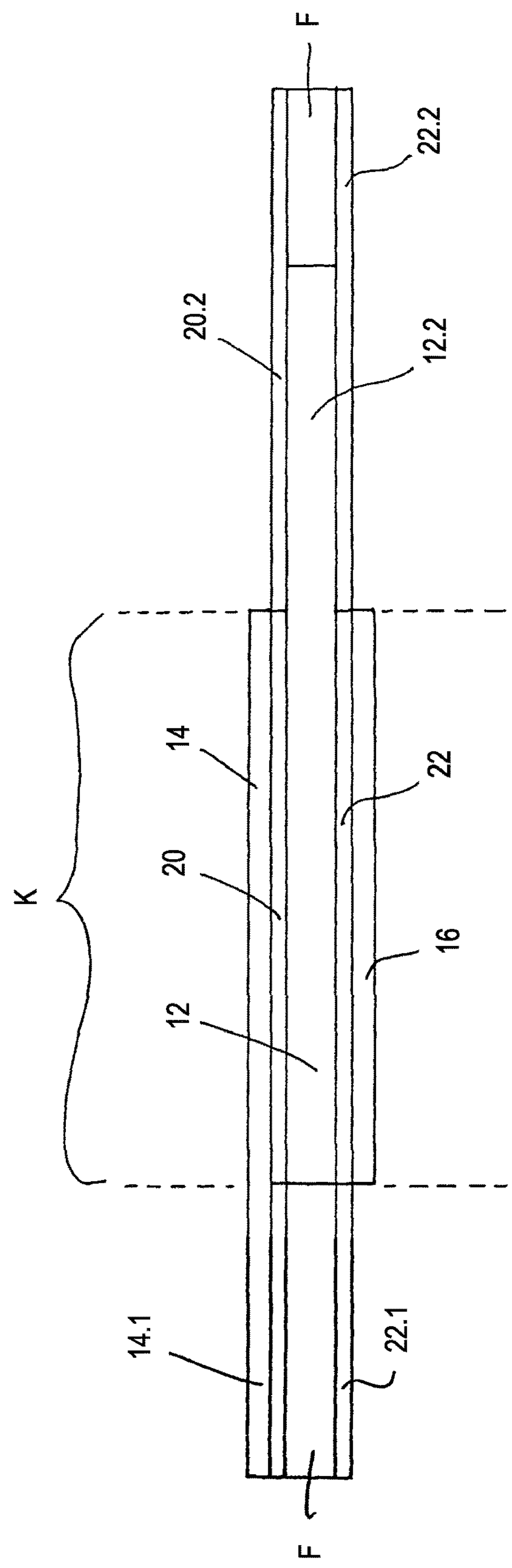

FIG. 4 depicts the multilayer structure after an etching process: the sections 16.1 and 16.2 of the second further electrically conductive layer 16 extending beyond the core region have been etched away, as has one of the two projecting sections 14.2 of the first further electrically conductive layer 14. The prepreg layers are unaffected by the etching step, as are the projecting sections 14.1 and 12.2 (which will still be needed later) of the first further layer 14 and carrier layer 12.

Figure 5:
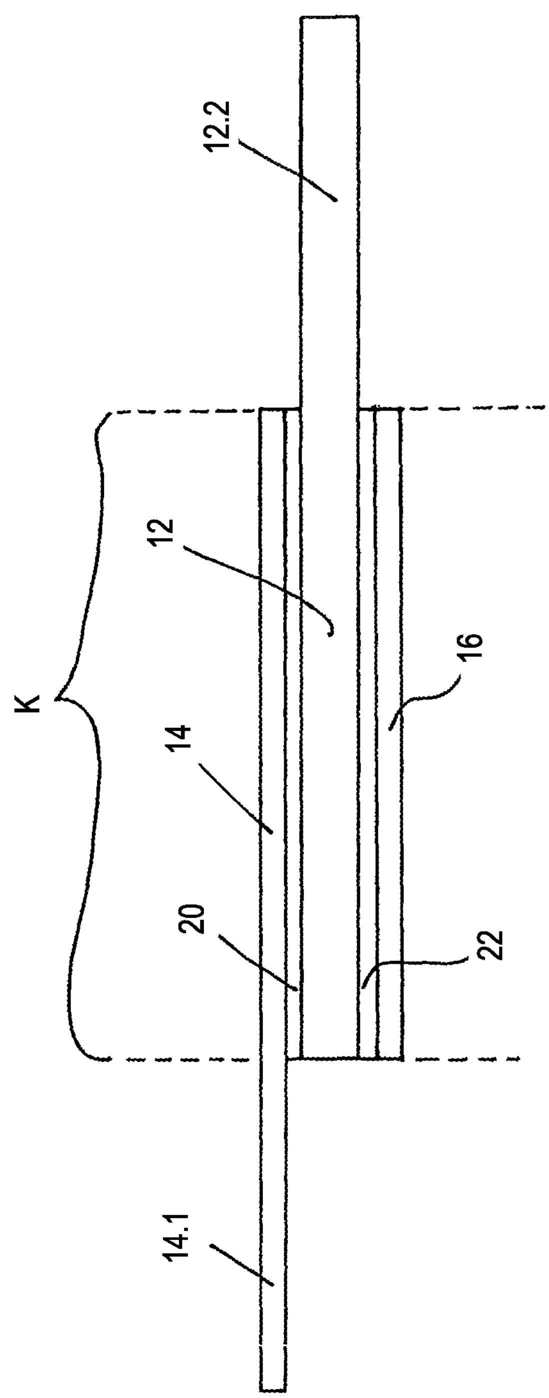
Figure 6:
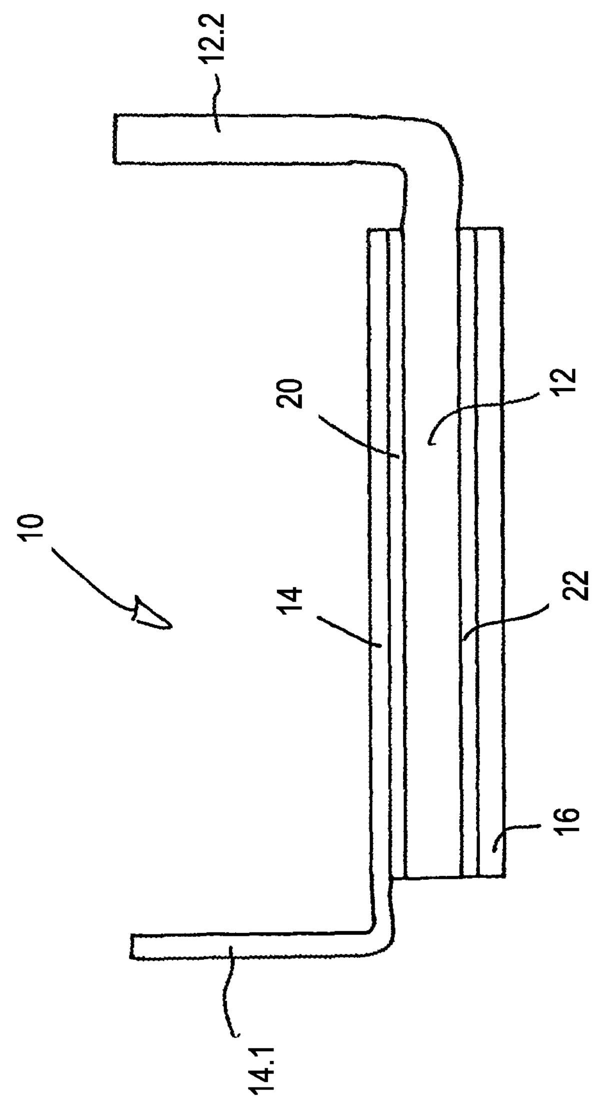

In a further step, the exposed prepreg layers 20.1, 20.2, 22.1 and 22.2 are substantially removed through milling (depth milling) (cf. FIG. 5), leaving a multilayer structure 10 the layers of which correspond in the "core region" to the desired dimensions, with two of the layers each having one layer section 14.1, 12.2 projecting beyond the multilayer structure 10. These layer sections 14.1, 12.2 are defined as connection regions, and are bent as necessary in a subsequent process step such that they serve to directly contact a passive component (cf. FIG. 6). The connection regions may be formed as tabs or strips according to the invention. In particular, the connection regions are so formed as to be suited for directly contacting at least one further passive component without the need for additional connecting means (such as, in particular, cables, etc.).

The connection regions 14.1, 12.2 so formed can then be connected to a passive components, in the present exemplary embodiment a condenser C, C', e.g. by soldering, if necessary via a Schoop layer.

In addition, one or both of the connection regions 14.1, 12.2 can be formed as at least one load inductor L, in that the conductive connection region is enclosed e.g. in ferrite cores. The structure can also be connected to a heat sink 60. The final product may be potted (casting 70; cf. FIG. 1).

Figure 7:
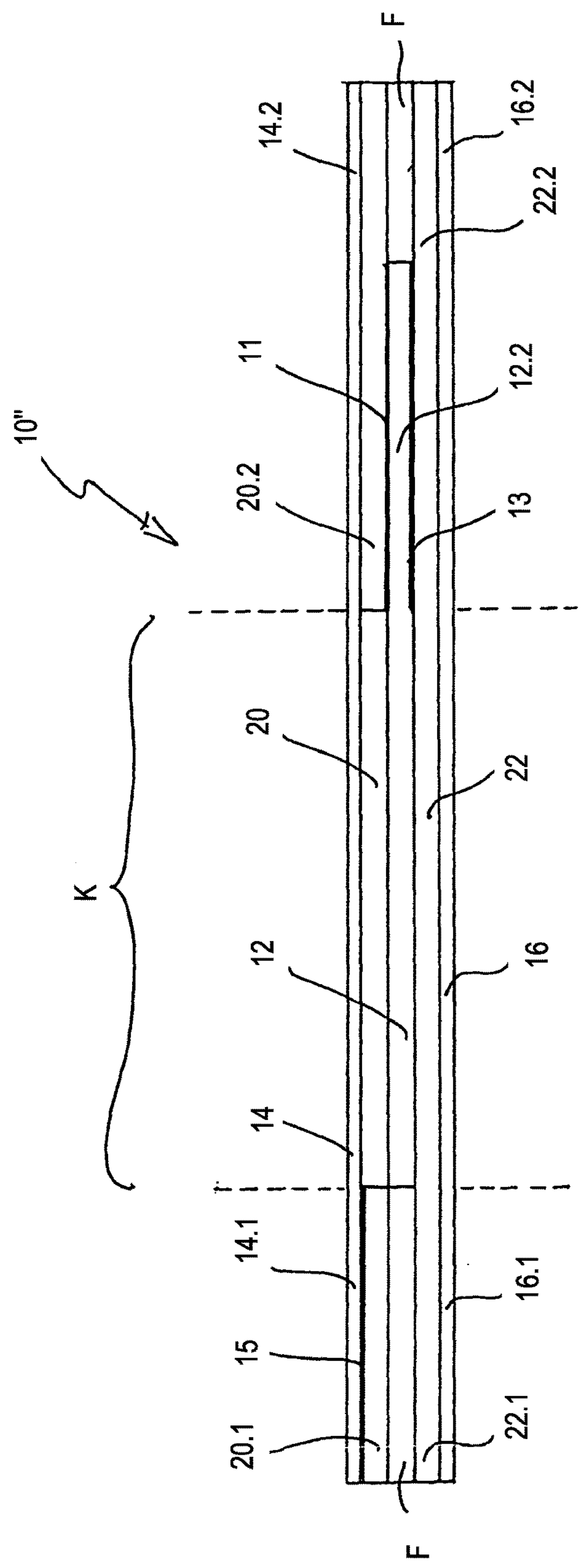
FIG. 7 shows a multilayer structure with separation layers for use in the production of connection regions according to the invention.

One variant of the initial multilayer structure 10" is shown in FIG. 7. The basic structure of the multilayer structure corresponds with the depiction of FIG. 3, with the difference that separating foils 11, 13, 15 are provided between the projecting layer sections 14.1 and 12.1 and their adjacent prepreg layer sections 20.1, 20.2, 22.2, said foils permitting or easing the separation by mechanical means (through pulling, peeling, etc.) of the prepreg layer sections 20.1, 20.2, 22.2 from the eventual/future connection regions 14.1, 12.2. To this end, the contour of the region to be removed is depth milled in order to provide access to the separating foil. The advantage is that only the contour, and not the entire surface, need by milled, etched or lasered. Instead of the separating foil described and depicted (which may be, e.g., a teflon or teflon-like film), any other separating means may be used that prevents the prepreg layer from sticking to the electrically conducting layer. This separating means can also be a suitable liquid or paste-like material applied via screen printing, spraying, or immersion.

Figure 8:
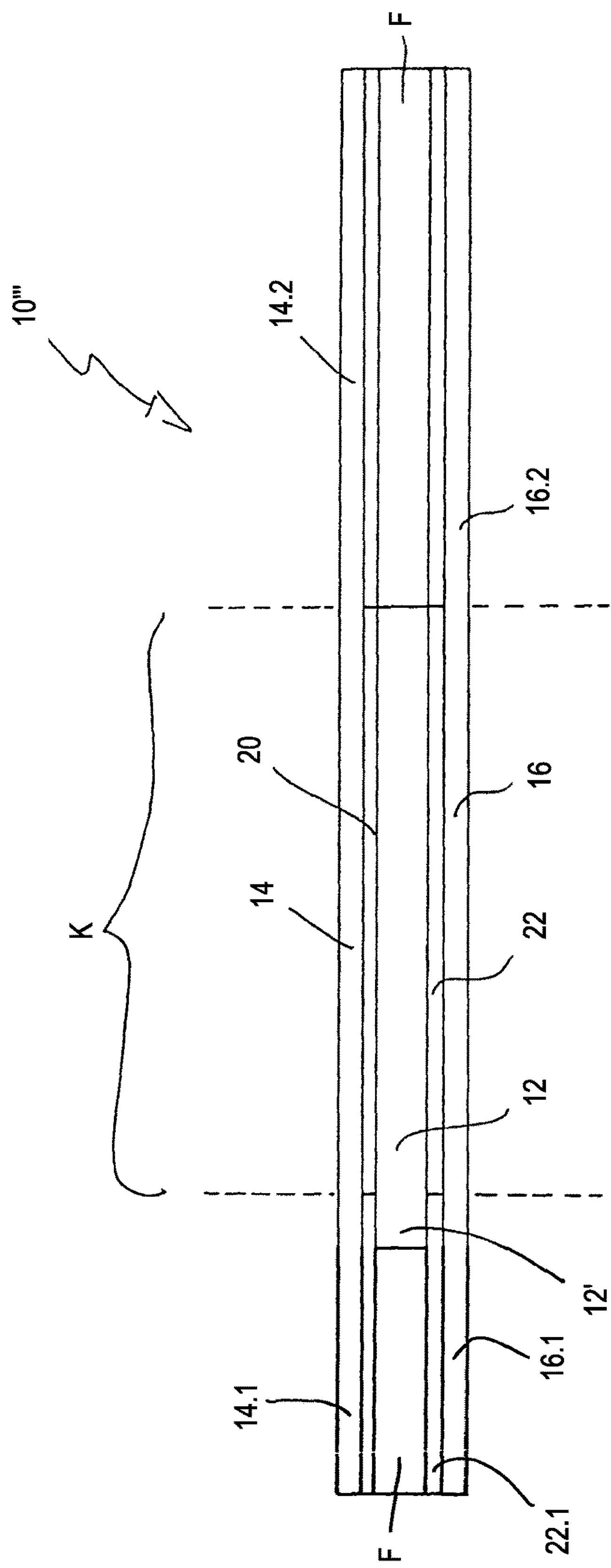
FIGS. 8 through 12 illustrate an alternative production of the connection regions according to the invention.

A further variant, as illustrated in FIG. 8, provides for what is called "plane offsetting".

In this variant of embodiment, a multilayer structure 10''' is provided in which the carrier layer 12 extends only slightly beyond the "core region" (reference sign 12'). The further electrically conductive layer 14 is—as in the previous exemplary embodiments—extended on both sides beyond the core region (reference signs 14.1 and 14.2).

Figure 9:
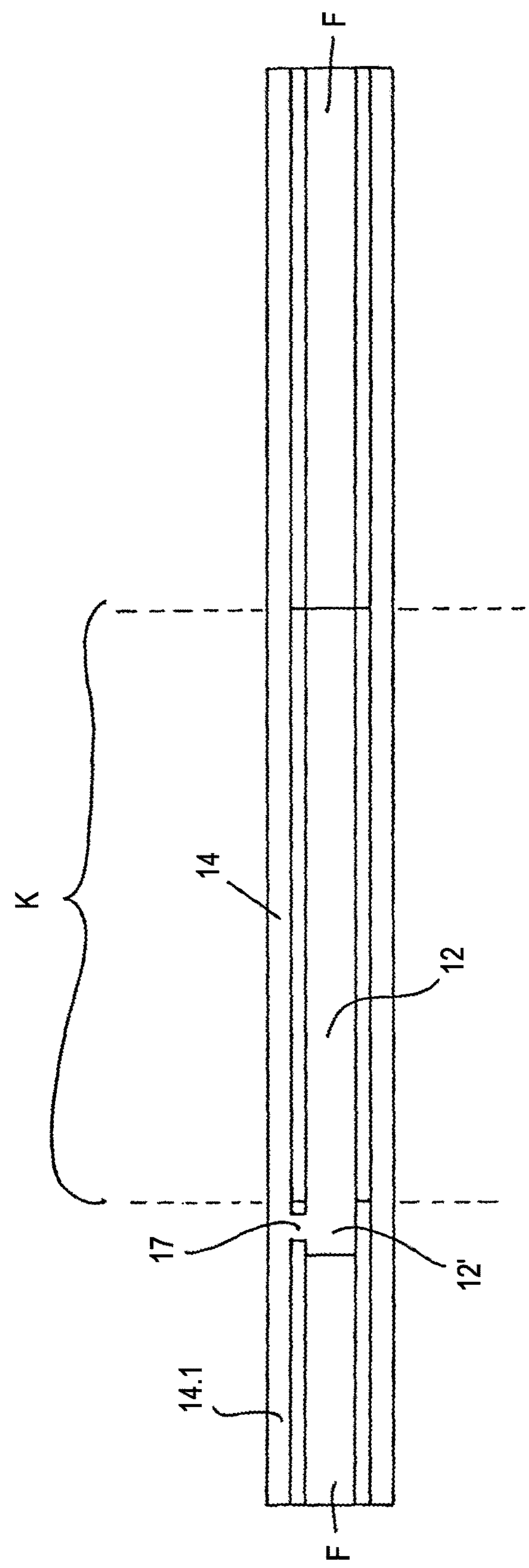
Figure 10:
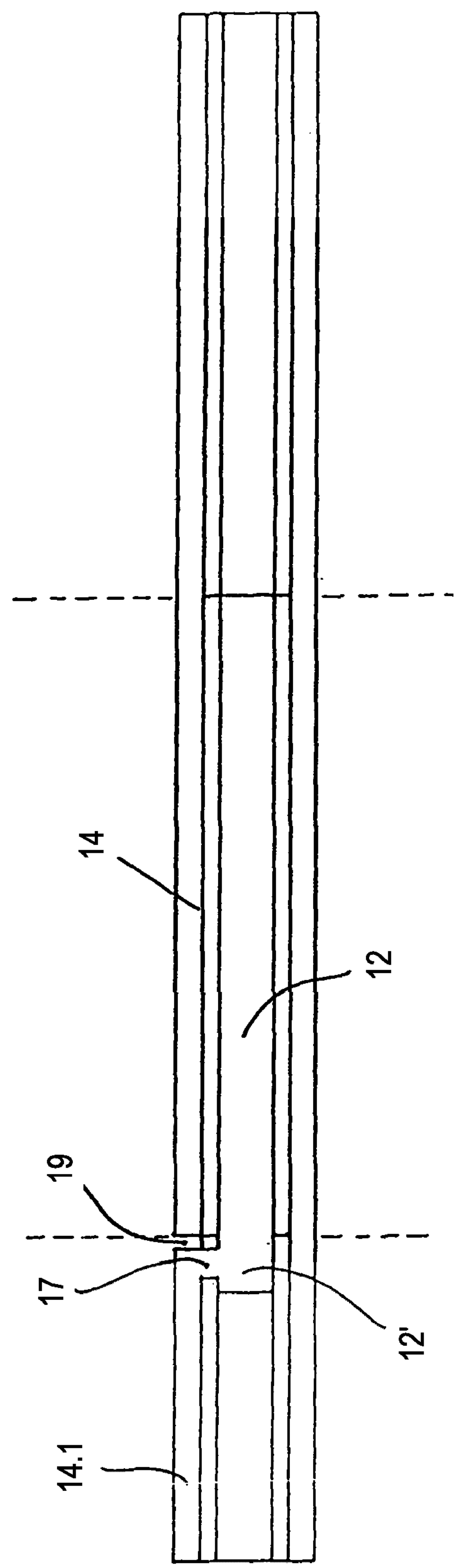

In a next step, a through-connection 17 (which may consist of several through-connections, e.g. in the form of one or more rows of through-connections) is made from the extended layer section 14.1 of the first further electrically conductive layer 14 to the short projection 12' of the carrier layer 12 positioned beneath it (cf. FIG. 9), followed by a separation of the layer section 14.1 from the first further electrically conductive layer 14 at the boundary of the "core region" and before the through-connection 17 (cf. FIG. 10, reference sign 19). In this way, a contact is established between the (somewhat thicker) carrier layer 12 and the (thinner) connection region 14.1 of the further electrically conductive layer 14, so that the carrier layer 12 has a thinner "auxiliary" connection region. The effect is that the connection regions both i) are on the same level and ii) have the same thickness.

Figure 11:
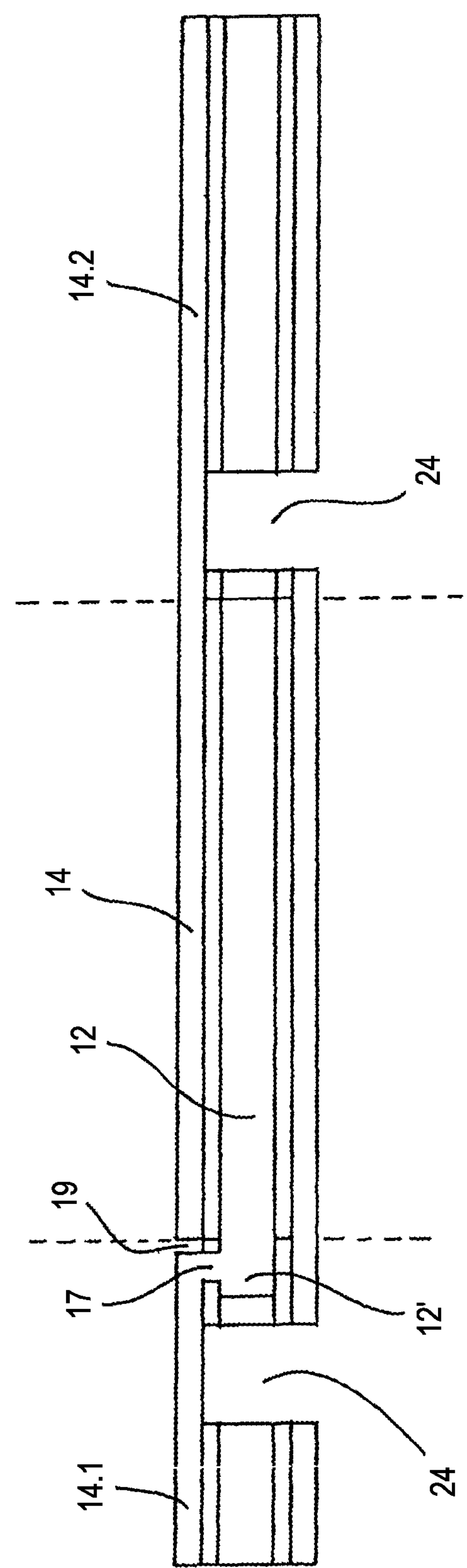

Subsequently, depth millings are carried out from the side opposite the first further electrically conductive layer 14, i.e. from the side of the second electrically conductive layer 16, in order to create a bending region 24 on either side of the core region. These depth millings are carried out outside the core region, but close to it, so that the connection regions can be bent as close to the core region as possible. The depth millings go through all layers except the connection regions 14.1 and 14.2 (cf. FIG. 11).

Figure 12:
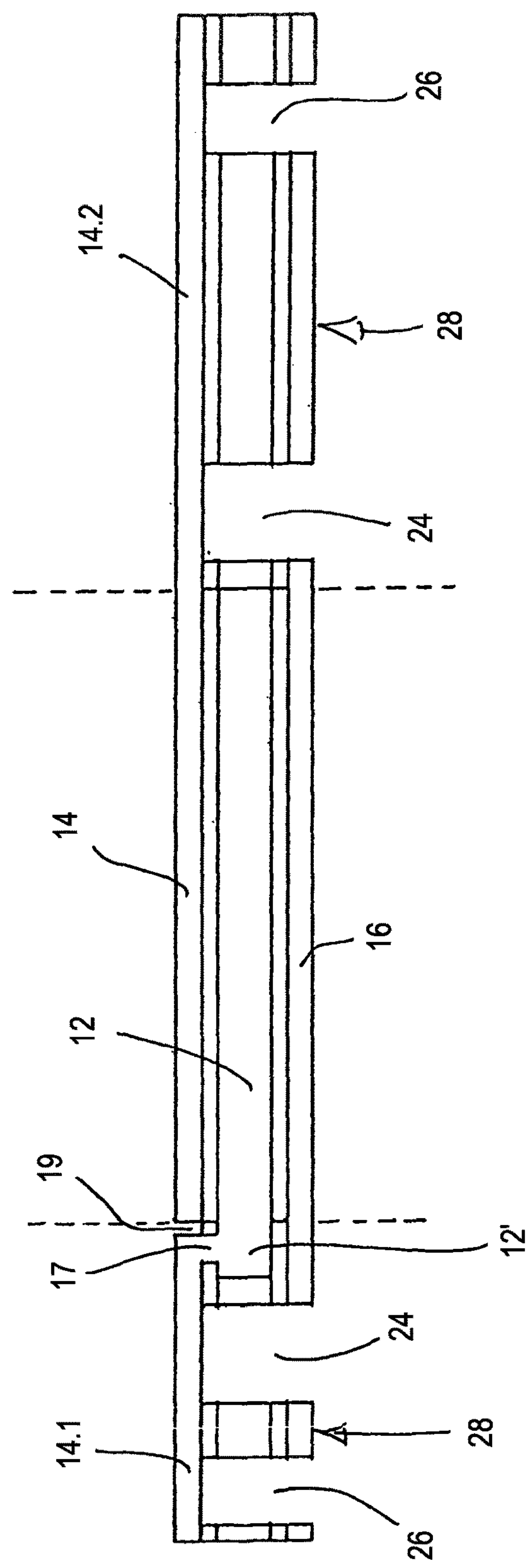

Finally, two depth millings may be carried out, also from the side opposite the first further electrically conductive layer 14, i.e. from the side of the second electrically conductive layer 16. These second depth millings serve to create solder connections 26 in order to make it possible to connect the passive component (cf. FIG. 12). The remaining regions 28 with sequences of layers below the connection regions 14.1 and 14.2 can serve during potting as spacers between a housing surrounding the electronic assembly group (not shown).

Figure 13:
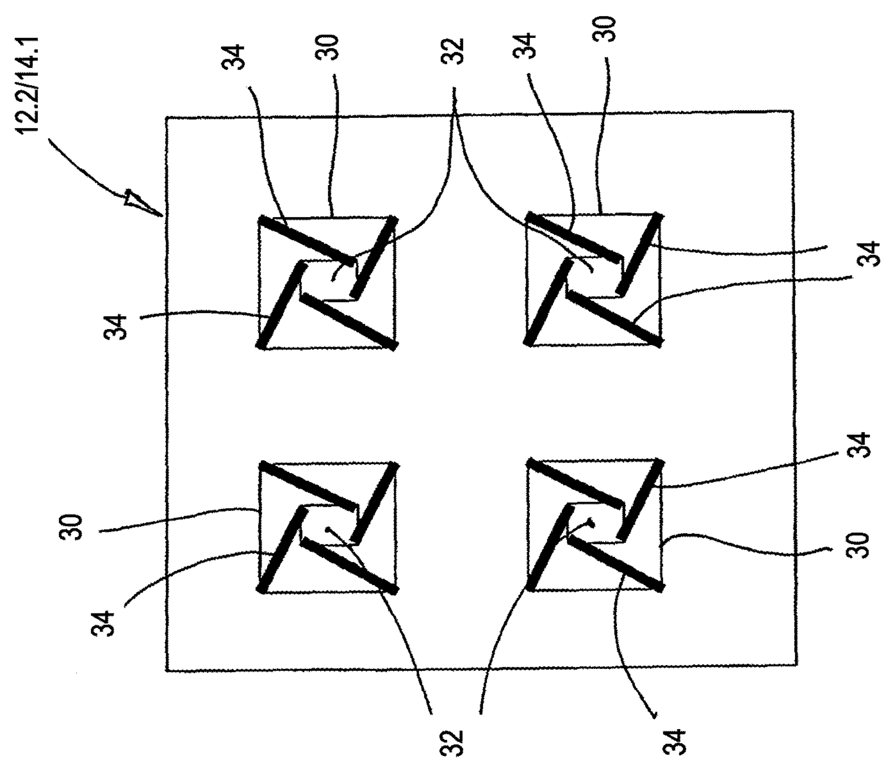
FIG. 13 shows a top view of an arrangement of a connection region according to the invention.

FIG. 13 shows an extract of a plan view of an embodiment of a connection region 12.2 or 14.1 according to the invention. The connection region has one or (as depicted) multiple recesses 30 (the embodiment of FIG. 13 has four such recesses). Each recess 30 is provided with a contact pad 32 which is provided and formed for welding or soldering to a contact of the passive component to be connected. In the embodiment shown, the contact pad 32 has an essentially quadratic outline/footprint, though it may take any other suitable form.

The contact pad 32 is connected electrically to the connection region by means of at least one holding web/bar 34. In the embodiment shown, four holding webs 34 are provided for each contact pad 32; however, more or fewer may be used. The holding webs 34 have a lower thermal cross-section than the surrounding connection region, thus simplifying the process of attachment via welding or soldering.

The holding webs 34 are additionally designed so as to compensate for different coefficients of expansion during operation (which involves heating). This occurs because the holding webs 34 are suited for absorbing mechanical stress loads. In the embodiment shown, the geometrical arrangement is such that, for straight holding bars or webs 34, a twisting of the contact pad 32 is possible. This is achieved through a broken symmetry when connecting the contact pad and the connection region. Another possibility (not shown) is, e.g., to design the holding webs in a meander or zig-zag shape.

The invention thus permits direct connection of a passive component to a multilayer printed circuit board structure without additional connecting means, cables, bond wires, etc. Only the actual connection (generally by means of soldering) of the component need be performed. The contact paths are thus shortened, the number of solder connections decreased and reliability consequently increased, parasitic inductances are reduced, and integration density is increased.

We claim:

1. Electronic assembly, comprising:

a printed circuit board structure, which comprises a multilayer structure that has an electrically conductive carrier layer with a semiconductor component and a further electrically conductive layer connected to the semiconductor component;

a passive component, which is connected to the electrically conductive carrier layer and the further electrically conductive layer;

the electrically conductive carrier layer and the further electrically conductive layer respectively having one portion that extends beyond a core region of the multilayer structure with connection regions formed on it;

layer portions that protrude beyond the core region and are not required as connection regions are at least partially removed and prepreg layer portions that protrude beyond the core region are at least partially removed; and the passive component making contact directly at the connection regions.

2. Electronic assembly according to claim 1, wherein the passive component is a capacitor or an inductor.

3. Electronic assembly according to claim 1, wherein the passive component is an annular capacitor surrounding the printed circuit board structure, and wherein a load inductor directly connected to the connection regions is provided.

4. Electronic assembly according to claim 3, wherein the printed circuit board structure is connected to a heat sink, or wherein the load inductor directly connected to the connection regions is directly connected to a heat sink, or mounted or potted in a casting jacket.

5. Electronic assembly according to claim 1, wherein at least one of the connection regions has at least one recess with a contact pad contained therein for making contact with the passive component.

6. Electronic assembly according to claim 5, wherein the contact pad is designed to make direct contact with a Schoop layer of a foil capacitor, or wherein the contact pad is electrically connected to the connection regions by means of at least one holding web, or wherein the contact pad is electrically connected to the connection regions by means of at least one holding web and the holding web is designed so as to compensate for different coefficients of expansion during operation.

7. Electric motor, comprising:

an electronic assembly designed as a rectifier or inverter;

the electronic assembly comprising a printed circuit board structure of a multilayer structure that has an electrically conductive carrier layer with a semiconductor component and a further electrically conductive layer connected to the semiconductor component;

a passive component, which is connected to the electrically conductive carrier layer and the further electrically conductive layer;

the electrically conductive carrier layer and the further electrically conductive layer respectively having one portion that extends beyond a core region of the multilayer structure with connection regions formed on it;

layer portions that protrude beyond the core region and are not required as connection regions are at least partially removed and prepreg layer portions that protrude beyond the core region are at least partially removed;

the passive component making contact directly at the connection regions; and the printed circuit board structure is directly mounted on a cooling region of the electric motor.

8. Method for producing an electronic assembly, comprising:

providing a printed circuit board having a multilayer structure having an electrically conductive carrier layer and a further electrically conductive layer, which respectively have one portion that extends beyond a core region of the multilayer structure;

at least partially removing layer portions that protrude beyond the core region and are not required as a connection region;

at least partially removing prepreg layer portions that protrude beyond the core region;

forming connection regions on the remaining layer portions that protrude beyond the core region; and making direct contact between a passive element and the connection regions.

9. Method according to claim 8, wherein the step of forming the connection regions comprises the step of bending the remaining layer portions that protrude beyond the core region.

10. Method according to claim 8, wherein before the step of at least partially removing the layer portions that protrude beyond the core region and are not required as a connection region, the following steps are carried out:

producing a through-contact between a protruding layer portion of the further electrically conductive layer and a protruding layer portion of the electrically conductive carrier layer;

separating the protruding layer portion of the further electrically conductive layer from the further electrically conductive layer.

11. Method according to claim 8, wherein the at least partially removing steps are carried out as follows:

forming a bending region on either side of the core region by limited removal of all the layers apart from the connection regions by means of deep milling.

12. Method according to claim 8, wherein after the at least partially removing steps, remaining regions with layer sequences below the connection regions act as spacers with respect to a housing surrounding the electronic assembly.

13. Method according to claim 8, wherein separating means for mechanically removing the prepreg layer portions from the later connection regions are provided between the layer portions that protrude and their adjacent prepreg layer portions.

14. Method according to claim 8, wherein the at least removing layer portions that are not required as a connection region is performed by etching, and the at least removing prepreg layer portions that protrude beyond the core region is performed by milling.

15. Method according to claim 8, wherein the layer portions that protrude beyond the core region and are not required as a connection region and the prepreg layer portions that protrude beyond the core region are substantially completely removed.

* * * * *